US012521771B2

(12) United States Patent
Song et al.

(10) Patent No.: US 12,521,771 B2
(45) Date of Patent: Jan. 13, 2026

(54) LIQUID SUPPLY UNIT, AND SUBSTRATE TREATING APPARATUS INCLUDING THE SAME

(71) Applicant: SEMES CO., LTD., Cheonan-si (KR)

(72) Inventors: Jun Ho Song, Hwaseong-si (KR); Min Hee Cho, Suwon-si (KR); Won Young Kang, Hwaseong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 477 days.

(21) Appl. No.: 18/058,570

(22) Filed: Nov. 23, 2022

(65) Prior Publication Data

US 2023/0166302 A1    Jun. 1, 2023

(30) Foreign Application Priority Data

Dec. 1, 2021   (KR) .................. 10-2021-0170437

(51) Int. Cl.
*B08B 3/10*     (2006.01)
*B08B 3/02*     (2006.01)
(Continued)

(52) U.S. Cl.
CPC ............. *B08B 3/10* (2013.01); *B08B 3/022* (2013.01); *B08B 3/041* (2013.01); *B08B 3/08* (2013.01);
(Continued)

(58) Field of Classification Search
CPC .......... B08B 3/10; B08B 3/022; B08B 3/041; B08B 3/08; B08B 13/10; F24H 1/122; H05B 3/48
(Continued)

(56) References Cited

U.S. PATENT DOCUMENTS

| 3,053,959 A | * | 9/1962 | Christmann | ........... | H05B 6/108 |
| | | | | | 219/629 |
| 2002/0023919 A1 | * | 2/2002 | Toya | ................... | H05B 3/46 |
| | | | | | 219/544 |

(Continued)

FOREIGN PATENT DOCUMENTS

| CN | 210508148 U | 5/2020 |
| JP | 2000-121153 A | 4/2000 |

(Continued)

OTHER PUBLICATIONS

Machine translation of KR-20160041160-A (Year: 2016).*

(Continued)

*Primary Examiner* — Michael E Barr
*Assistant Examiner* — Thomas Bucci
(74) *Attorney, Agent, or Firm* — Harness, Dickey & Pierce, P.L.C.

(57) ABSTRACT

Provided is a liquid supply unit for supplying a treatment liquid to a nozzle that discharges the treatment liquid to a substrate, the liquid supply unit including: a tank for storing the treatment liquid; a main circulation line for supplying the treatment liquid from an internal space of the tank to the nozzle or for recovering the treatment liquid to the internal space of the tank; a supply line connected to the main circulation line to supply the treatment liquid to the nozzle; and a heater module installed in the main circulation line and heating the treatment liquid flowing through the main circulation line to a predetermined temperature, in which the heater module includes: a pipe in which the treatment liquid flows and which is made of a quartz material; and a heating element provided on a surface of the pipe.

16 Claims, 7 Drawing Sheets

(51) Int. Cl.
  *B08B 3/04* (2006.01)
  *B08B 3/08* (2006.01)
  *B08B 13/00* (2006.01)
  *F24H 1/12* (2022.01)
  *H01L 21/67* (2006.01)
  *H05B 3/12* (2006.01)
  *H05B 3/14* (2006.01)
  *H05B 3/48* (2006.01)

(52) U.S. Cl.
  CPC ............ *B08B 13/00* (2013.01); *F24H 1/122* (2013.01); *H05B 3/48* (2013.01); *B08B 2203/007* (2013.01); *H01L 21/67051* (2013.01); *H05B 3/12* (2013.01); *H05B 3/145* (2013.01); *H05B 2203/013* (2013.01); *H05B 2203/016* (2013.01); *H05B 2203/021* (2013.01)

(58) Field of Classification Search
  USPC ........................................................ 134/105
  See application file for complete search history.

(56) References Cited

U.S. PATENT DOCUMENTS

| | | | |
|---|---|---|---|
| 2003/0102304 A1* | 6/2003 | Boyers | C03C 23/00 219/628 |
| 2011/0194846 A1* | 8/2011 | Wang | B82Y 30/00 392/482 |
| 2013/0048609 A1* | 2/2013 | Ito | B08B 3/08 118/712 |
| 2017/0062242 A1* | 3/2017 | Kim | H01L 21/6708 |

FOREIGN PATENT DOCUMENTS

| | | | | |
|---|---|---|---|---|
| JP | 2007051815 A | * | 3/2007 | |
| JP | 2012-252127 A | | 12/2012 | |
| JP | 5508651 B2 | | 6/2014 | |
| KR | 101487270 B1 | | 1/2015 | |
| KR | 10-2016-0041160 A | | 4/2016 | |
| KR | 20160041160 A | * | 4/2016 | ....... H01L 21/02052 |
| KR | 102098599 B1 | | 4/2020 | |

OTHER PUBLICATIONS

Japanese Office Action dated Jan. 30, 2024 issued in corresponding Japanese Appln. No. 2022-189860.
Korean Office Action dated Sep. 29, 2025 issued in Korean Patent Application No. 10-2021-0170437.

* cited by examiner

LIQUID SUPPLY UNIT, AND SUBSTRATE TREATING APPARATUS INCLUDING THE SAME

CROSS-REFERENCE TO RELATED APPLICATIONS

This application claims priority to and the benefit of Korean Patent Application No. 10-2021-0170437 filed in the Korean Intellectual Property Office on Dec. 1, 2021, the entire contents of which are incorporated herein by reference.

TECHNICAL FIELD

The present invention relates to a liquid supply unit, and a substrate treating apparatus including the same.

BACKGROUND ART

Contaminants, such as particles, organic contaminants, and metal contaminants, remaining on the surface of the substrate greatly affect the characteristics and production yield of semiconductor devices. For this reason, a cleaning process of removing various contaminants adhering to the surface of the substrate is very important in the semiconductor manufacturing process, and a process of cleaning the substrate is performed before and after each unit process of manufacturing a semiconductor.

In general, the cleaning process of the substrate includes a chemical treatment process for removing metal foreign substances, organic substances and/or particles remaining on the substrate by supplying chemicals to the substrate that is supported and rotated by a support unit, a rinse process in which pure water is supplied to the substrate to remove the chemicals remaining in the substrate acid, a substitution process of supplying an organic solvent, such as an isopropyl alcohol (IPA) solution, to the substrate to replace the pure water on the substrate with the organic solvent, and a drying process of removing the substituted organic solvent from the substrate. In this case, the liquids supplied onto the substrate may be provided by being heated to a predetermined temperature.

In order to supply a high-temperature liquid to the substrate, a heater module for heating the liquid is used. In general, a heater module includes a pipe based on fluororesin, such as PFA and PTFE, and a heating element (heat source) based on a metal, such as aluminum, stainless steel, and nickel-chromium (Ni—Cr). In this case, heat transfer is performed in the order of the heating element, a heat transfer core, the pipe, and a liquid, and there are many heat transfer steps, so there is a problem that the temperature increase efficiency is lowered.

In addition, the metal-based heating element continuously transmits high-temperature heat to the fluororesin-based pipe, thereby causing damage to the pipe. Damage to the pipe may cause contamination of the liquid flowing therein, and there is a problem in that the risk of occurrence of liquid leakage of the heater module increases.

In addition, the fluororesin-based pipe has absorption and permeation properties, allowing particulate to migrate from the heating element. In this case, there is a problem in that the heated liquid is contaminated by metal particles generated from the metal-based heating element.

SUMMARY OF THE INVENTION

The present invention has been made in an effort to provide a liquid supply unit capable of increasing temperature increase efficiency by minimizing a heat transfer step in supplying a high-temperature treatment liquid, and a substrate treating apparatus including the same.

The present invention has also been made in an effort to provide a liquid supply unit capable of preventing damage to a pipe through which a treatment liquid flows therein in a heater module heating the treatment liquid to a predetermined temperature, and a substrate treating apparatus including the same.

The present invention has also been made in an effort to provide a liquid supply unit capable of preventing a treatment liquid from being contaminated by metal particles while the treatment liquid is heated to a predetermined temperature by a heater module, and a substrate treating apparatus including the same.

The object of the present invention is not limited thereto, and other objects not mentioned will be clearly understood by those of ordinary skill in the art from the following description.

An exemplary embodiment of the present invention provides an apparatus for treating a substrate, the apparatus including: a chamber having a processing space; a support unit for supporting and rotating the substrate in the processing space; a nozzle for supplying a high-temperature treatment liquid to the substrate supported by the support unit; and a liquid supply unit for supplying the high-temperature treatment liquid to the nozzle, in which the liquid supply unit includes: a tank for storing the treatment liquid; a main circulation line for supplying the treatment liquid from an internal space of the tank to the nozzle or for recovering the treatment liquid to the internal space of the tank; and a connection line connected to the main circulation line to supply the treatment liquid to the nozzle, and a heater module for heating the treatment liquid to a predetermined temperature is installed in the main circulation line, and the heater module includes: a pipe in which the treatment liquid flows and which is made of a quartz material; and a heating element provided on a surface of the pipe.

The heating element may be provided on the surface of the pipe in a printing manner.

The heater module may include a conductor terminal provided on the surface of the pipe, and a terminal block which is coupled onto the conductor terminal and receives power from the outside, and at least a portion of the conductor terminal may be in contact with the heating element.

The heating element may include a first portion extending in a longitudinal direction of the pipe while being in contact with the surface of the pipe, a second portion extending upwardly from the first portion, and a third portion extending in the longitudinal direction of the pipe from the second portion, the second portion may be in contact with one end of the conductor terminal, and the third portion may be in contact with the surface of the conductor terminal.

The heater module may include the heating element and an insulator covering an exposed portion of the heating element.

The conductor terminal and the terminal block may be electrically connected through a conductive adhesive.

The heating element and the conductor terminal may be made of metal.

The heating element may be made of AgPd or graphite, the conductor terminal may be made of with silver (Ag), and the conductive adhesive may be provided as a silver paste (Ag sintering).

The insulator may be made of silicon dioxide ($SiO_2$).

The main circulation line may include a supply line for supplying the treatment liquid stored in the internal space of the tank to the nozzle, and a recovery line for recovering the treatment liquid from the nozzle to the tank, and the heater module may be installed in the supply line.

The heater module may include a temperature sensor for measuring a temperature of the heating element.

The liquid supply unit may include an internal circulation line for circulating the treatment liquid stored in the internal space of the tank, and the heater module may be installed in the internal circulation line.

The treatment liquid may be provided as isopropyl alcohol (IPA).

Another exemplary embodiment of the present invention provides a liquid supply unit for supplying a treatment liquid to a nozzle that discharges the treatment liquid to a substrate, the liquid supply unit including: a tank for storing the treatment liquid; a main circulation line for supplying the treatment liquid from an internal space of the tank to the nozzle or for recovering the treatment liquid to the internal space of the tank; a supply line connected to the main circulation line to supply the treatment liquid to the nozzle; and a heater module installed in the main circulation line and heating the treatment liquid flowing through the main circulation line to a predetermined temperature, in which the heater module includes: a pipe in which the treatment liquid flows and which is made of a quartz material; and a heating element provided on a surface of the pipe.

The heater module may include a conductor terminal provided on the surface of the pipe, and a terminal block which is coupled onto the conductor terminal and receives power from the outside, and at least a portion of the conductor terminal may be in contact with the heating element.

The conductor terminal may be provided on the surface of the pipe in a cylindrical printing manner, and the conductor terminal and the terminal block may be electrically connected through a conductive adhesive.

The heating element may include a first portion extending in a longitudinal direction of the pipe while being in contact with the surface of the pipe, a second portion extending upwardly from the first portion, and a third portion extending in the longitudinal direction of the pipe from the second portion, the second portion may be in contact with one end of the conductor terminal, and the third portion may be in contact with the surface of the conductor terminal.

The heater module may include the heating element and an insulator covering a contact portion between the heating element and the conductor terminal.

Still another exemplary embodiment of the present invention provides an apparatus for treating a substrate, the apparatus including: a chamber having a processing space; a support unit for supporting and rotating the substrate in the processing space; a nozzle for supplying a high-temperature treatment liquid to the substrate supported by the support unit; and a liquid supply unit for supplying the high-temperature treatment liquid to the nozzle, in which the liquid supply unit includes: a first tank and a second tank for storing the treatment liquid; a main circulation line for connecting the first tank and the second tank and supplying the treatment liquid to the nozzle or recovering the treatment liquid to an internal space of the first tank or an internal space of the second tank; and an internal circulation line for connecting the first tank and the second tank and heating the treatment liquid contained in the internal space of the first tank or the internal space of the second tank, the main circulation line includes a supply line branched from the main circulation line and supplying the treatment liquid to the nozzle, and a recovery line branched from the main circulation line and recovering the treatment liquid from the nozzle to the first tank or the second tank, the inner circulation line includes a lower circulation line connecting a lower wall of the first tank and a lower wall of the second tank, an upper circulation line connecting an upper wall of the first tank and an upper wall of the second tank, and a shared line connecting the lower circulation line and the upper circulation line, a heater module for heating the treatment liquid flowing therein to a predetermined temperature is installed in each of the supply line of the main circulation line and the shared line of the internal circulation line, and the heater module includes: a pipe in which the treatment liquid flows and which is made of a quartz material; a heating element provided on a surface of the pipe in a printing manner; a conductor terminal which is provided on the surface of the pipe in a printing manner, and at least a portion of which is in contact with the heating element; and a terminal block which is coupled onto the conductor terminal through a conductive adhesive and receives power from the outside.

The heater module may include an insulator covering an exposed portion of the heating element.

According to the exemplary embodiment of the present invention, the heat transfer operation in supplying a high-temperature treatment liquid may be minimized, thereby increasing the temperature increase efficiency.

Further, according to the exemplary embodiment of the present invention, in the heater module for heating the treatment liquid to a predetermined temperature, damage to the pipe through which the treatment liquid flows may be prevented.

Further, according to the exemplary embodiment of the present invention, it is possible to minimize the risk of leakage of the heater module.

Further, according to the exemplary embodiment of the present invention, it is possible to prevent the treatment liquid from being contaminated by metal particulates while the treatment liquid is heated to a predetermined temperature by the heater module.

The effect of the present invention is not limited to the foregoing effects, and the not-mentioned effects will be clearly understood by those skilled in the art from the present specification and the accompanying drawings.

DETAILED DESCRIPTION

Figure 1:
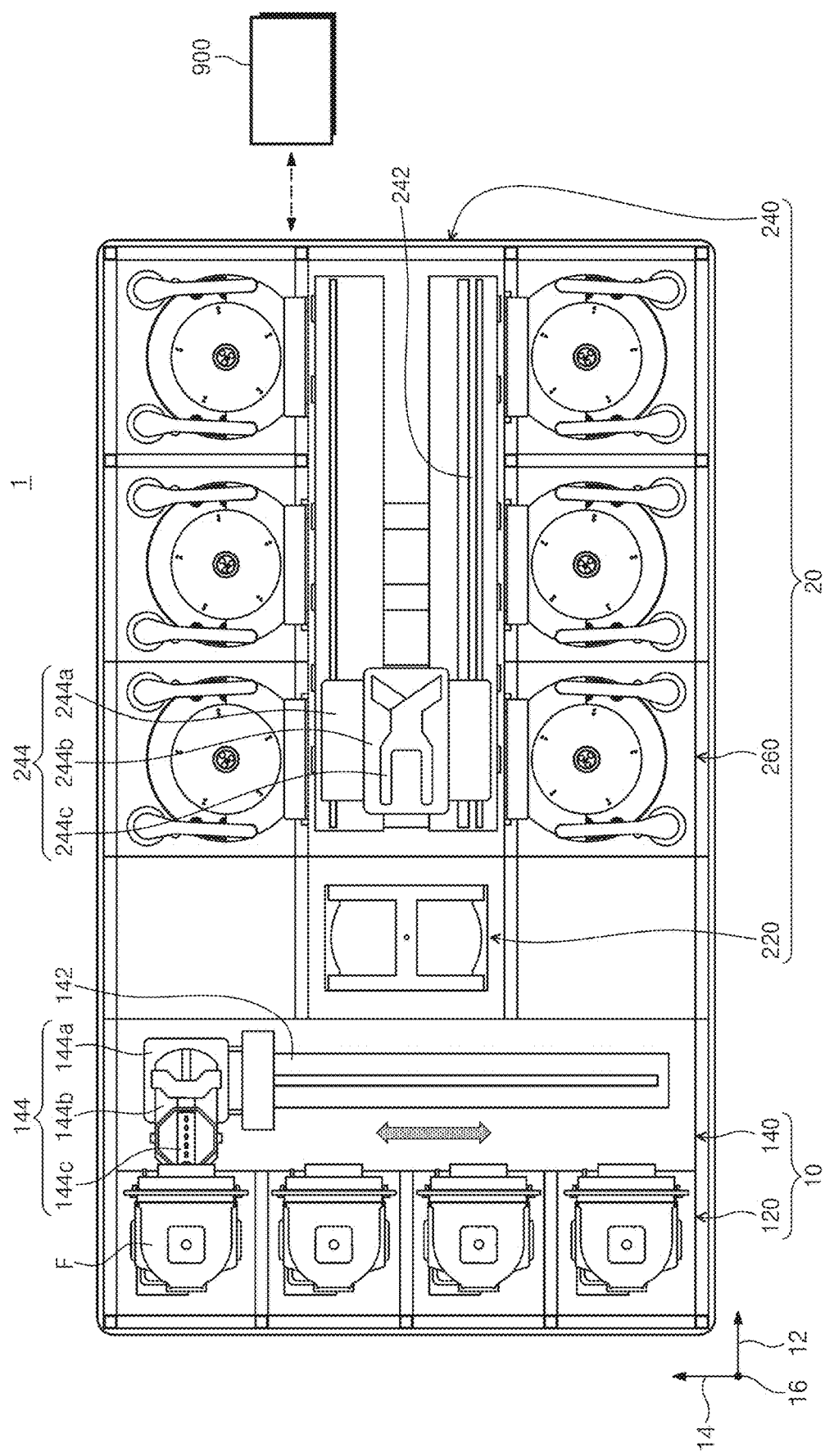
FIG. 1 is a cross-sectional view schematically illustrating a substrate processing facility according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

The apparatus of the present exemplary embodiment may be used to perform a cleaning process on a circular substrate. However, the technical spirit of the present invention is not limited thereto, and may be used in various types of processes for supplying a treatment liquid to the substrate while rotating the substrate. Hereinafter, a case in which a wafer is used as a substrate will be described as an example.

Hereinafter, an exemplary embodiment of the present invention will be described in detail with reference to the drawings.

FIG. 1 is a cross-sectional view schematically illustrating a substrate processing facility according to an exemplary embodiment of the present invention.

Referring to FIG. 1, a substrate processing facility 1 may include an index module 10 and a process processing module 20. The index module 10 may include a load port 120 and a transfer frame 140. The load port 120, the transfer frame 140, and the process processing module 20 may be sequentially arranged in series. Hereinafter, a direction in which the load port 120, the transfer frame 140, and the process processing module 20 are arranged is called to as a first direction 12, and a direction perpendicular to the first direction 12 when viewed from the top is called a second direction 14, and a direction perpendicular to a plane including the first direction 12 and the second direction 14 is called a third direction 16.

A carrier F in which a substrate W is accommodated is seated on the load port 120. The load port 120 is provided in plurality, and the plurality of load ports 120 may be arranged in series in the second direction 14. In FIG. 1, it is illustrated that four load ports 120 are provided, but the number of load ports 120 may be increased or decreased according to process efficiency of the process processing module 20 and a condition of foot print, and the like. A slot (not illustrated) provided to support the edge of the substrate may be formed in the carrier F. A plurality of slots may be provided in the third direction 16, and the substrates may be disposed in the carrier F to be stacked apart from each other along the third direction 16. As the carrier F, a Front Opening Unified Pod (FOUP) may be used.

The transfer frame 140 may carry the substrate W between the carrier F that is seated on the load port 120 and the buffer unit 220. The transfer frame 140 may be provided with an index rail 142 and an index robot 144. A longitudinal direction of the index rail 142 is provided to be parallel to the second direction 14. The index robot 144 may be installed on the index rail 142. The index robot 144 is linearly movable in the second direction 14 along the index rail 142. The index robot 144 includes a base 144a, a body 144b, and an index arm 144c. The base 144a is installed to be movable along the index rail 142. The body 144b is coupled to the base 144a. The body 144b may be provided to be movable in the third direction 16 on the base 144a. Further, the body 144b may be provided to be rotatable on the base 144a. The index arm 144c is coupled to the body 144b and is provided to be movable forwardly and backwardly with respect to the body 144b. A plurality of index arms 144c may be provided to be individually driven. The index arms 144c are disposed to be stacked in the state of being spaced apart from each other in the third direction 16. A part of the index arms 144c may be used when the substrate W is carried from the process processing module 20 to the carrier F, and another part of the plurality of index arms 144c may be used when the substrate W is carried from the carrier 130 to the process processing module 20. This may prevent the particles generated from the substrate W before the process processing from being attached to the substrate W after the process processing in the process in which the index robot 144 loads and unloads the substrate W.

The process processing module 20 may include a buffer unit 20, a transfer chamber 240, and a process chamber 260.

The buffer unit 220 may be disposed between the transfer frame 140 and the transfer chamber 240. The buffer unit 220 provides a space in which the substrate W stays before the substrate W is transferred between the transfer chamber 240 and the transfer frame 140. A slot (not illustrated) in which the substrate W is placed is provided inside the buffer unit 220, and a plurality of slots (not illustrated) may be provided so as to be spaced apart from each other in the third direction 16. In the buffer unit 220, a surface facing the transfer frame 140 and a surface facing the transfer chamber 240 may be opened.

The transfer chamber 240 may transfer the substrate W between the buffer unit 220 and the process chamber 260. A guide rail 242 and a main robot 244 are provided to the transfer chamber 240. The guide rail 242 is disposed so that its longitudinal direction is parallel to the first direction 12. The main robot 244 is installed on the guide rail 242 and linearly moved along the first direction 12 on the guide rail 242.

The transfer chamber 240 may disposed so that a longitudinal direction thereof is parallel to the first direction. The process chambers 260 may be disposed on both sides of the transfer chamber 240 in the second direction 14. The process chambers 260 may be provided to be symmetrical to each other with respect to the transfer chamber 240. Some of the process chambers 260 may be disposed along the longitudinal direction of the transfer chamber 240. Also, some of the process chambers 260 may be disposed to be stacked on each other. That is, the process chambers 260 may be disposed in an arrangement of A×B (A and B are natural numbers equal to or greater than 1) at both sides of the transfer chamber 240. Here, A is the number of process chambers 260 provided in a line along the first direction 12, and B is the number of process chambers 260 provided in a line along the third direction 16. When four or six process chambers 260 are provided at one side of the transfer chamber 240, the process chambers 260 may be disposed in an arrangement of 2×2 or 3×2. The number of process chambers 260 may be increased or decreased.

Unlike the foregoing, the process chamber 260 may be provided only to one side of the transfer chamber 240. In addition, the process chamber 260 may be provided as a single layer on one side and the other side of the transfer chamber 240. In addition, the process chamber 260 may be provided in various arrangements unlike the above.

The process chamber 260 disposed on one side of the transfer chamber 240 may perform the same process as the process chamber 260 disposed on the other side of the transfer chamber 240. For example, a process of liquid-processing the substrate W may be performed in the process chamber 260. Alternatively, the process chamber 260 disposed on one side of the transfer chamber 240 may perform a different process from the process chamber 260 disposed on the other side of the transfer chamber 240. For example, a liquid processing process may be performed in the process chamber 260 disposed on one side of the transfer chamber 240, and a substrate drying process may be performed in the process chamber 260 disposed on the other side 280 of the transfer chamber 240.

Hereinafter, the substrate treating apparatus 300 provided in the process chamber 260 will be described. In the present exemplary embodiment, the case where the substrate treating apparatus 300 performs a liquid processing process on the substrate will be described as an example. The liquid processing process includes a process of cleaning the substrate.

Figure 2:
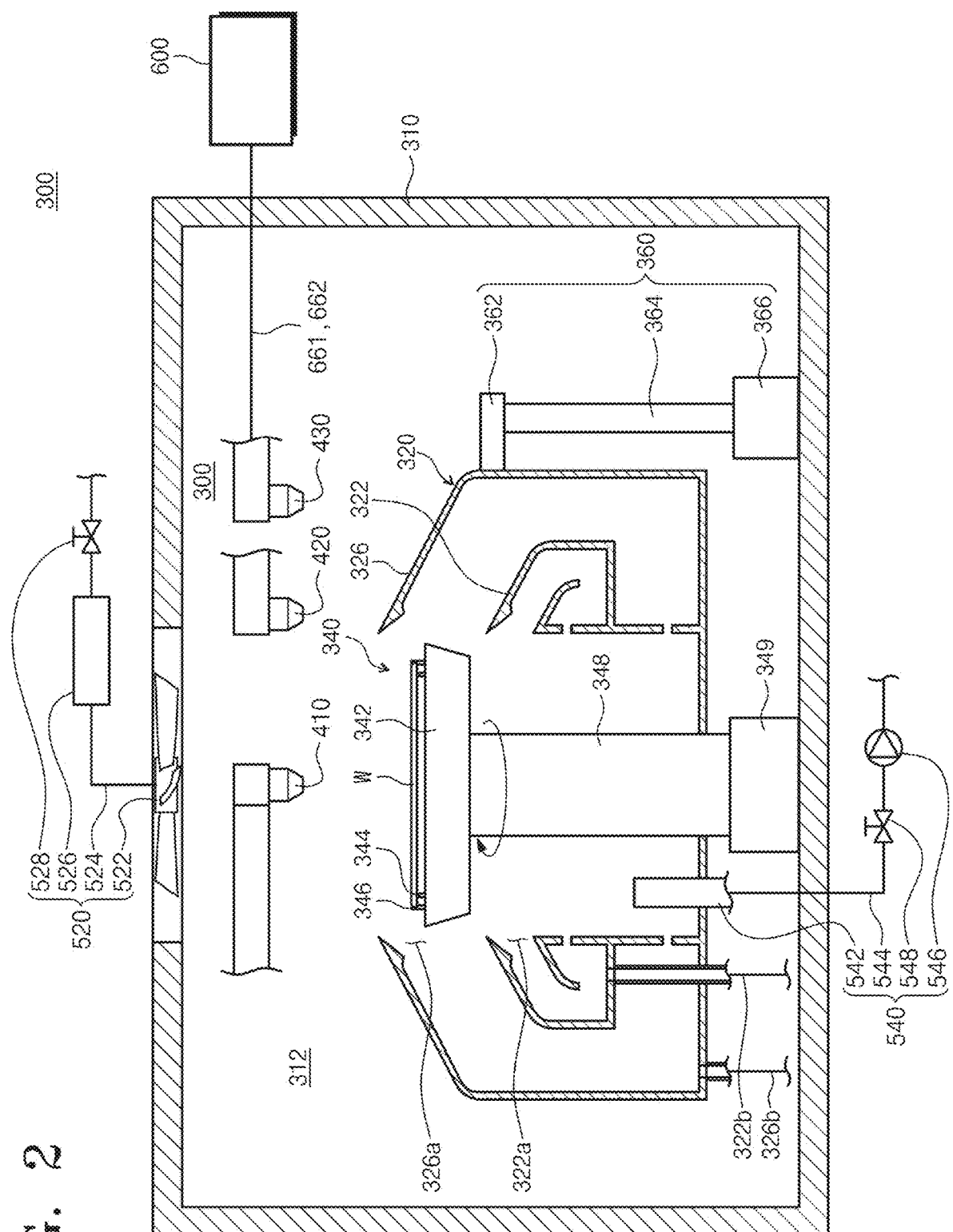
FIG. 2 is a cross-sectional view illustrating a substrate treating apparatus of FIG. 1.

FIG. 2 is a cross-sectional view illustrating the substrate treating apparatus of FIG. 1. Referring to FIG. 2, the substrate treating apparatus 300 includes a chamber 310, a processing vessel 320, a spin head 340, a lifting unit 360, a liquid discharge unit 400, an airflow forming unit 500, a liquid supply unit 600, and a controller 900. The chamber 310 may provide a processing space 312 in which a process for processing the substrate W is performed.

The processing vessel 320 is located in the processing space 312 and may be provided in a cup shape with an open top. When viewed from the top, the processing vessel 320 may be positioned to overlap an exhaust pipe 542. The processing vessel 320 may include an internal recovery container 322 and an external recovery container 326. Each of the recovery containers 322 and 326 may recover different treatment liquids from among the treatment liquids used in the process. The internal recovery container 322 may be provided in an annular ring shape surrounding the spin head 340, and the external recovery container 326 may be provided in an annular ring shape surrounding the internal recovery container 322. Each of an internal space 322a of the internal recovery container 322 and a space 326a between the external recovery container 326 and the internal recovery container 322 may be an inlet through which the treatment liquid is introduced into the internal recovery container 322 and the external recovery container 326. Recovery lines 322b and 326b extending vertically downwards from the bottoms of the recovery containers 322 and 326 may be connected to the recovery containers 322 and 326, respectively. The recovery lines 322b and 326b may be discharge pipes for discharging the treatment liquid introduced through the recovery containers 322 and 326. The discharged treatment liquid may be reused through an external treatment liquid regeneration system (not illustrated).

The spin head 340 is provided as a substrate support unit 340 that supports and rotates the substrate W. The spin head 340 may be disposed within the processing vessel 320. The spin head 340 may support the substrate W and rotate the substrate W during the process. The spin head 340 may include a body 342, a support pin 344, a chuck pin 346, and a support shaft 348. The body 342 may have a top surface that is provided as a generally circular shape when viewed from above. The support shaft 348 rotatable by a motor 349 may be fixedly coupled to the bottom surface of the body 342. A plurality of support pins 344 may be provided. The support pins 344 may be spaced apart from each other at a predetermined interval in an edge region of the upper surface of the body 342 and protrude upwardly from the body 342. The support pins 334 may be disposed to have an annular ring shape as a whole by combination with each other. The support pin 344 may support the bottom edge of the substrate W so that the substrate W is spaced apart from the upper surface of the body 342 by a predetermined distance. A plurality of chuck pins 346 may be provided. The chuck pin 346 may be disposed farther from the center of the body 342 than the support pin 344. The chuck pin 346 may be provided to protrude upwardly from the body 342. The chuck pin 346 may support the side portion of the substrate W so that the substrate W is not laterally separated from the original position when the spin head 340 is rotated. The chuck pin 346 may be provided to be linearly movable between a standby position and a support position along the radial direction of the body 342. The standby position may be a position farther from the center of the body 342 than the support position. When the substrate W is loaded or unloaded from the spin head 340, the chuck pin 346 may be positioned at the standby position, and when a process is performed on the substrate W, the chuck pin 346 may be positioned at the support position. In the supporting position, the chuck pin 346 may be in contact with the side portion of the substrate W.

The lifting unit 360 may adjust a relative height between the processing vessel 320 and the spin head 340. The lifting unit 360 may linearly move the processing vessel 320 in the vertical direction. The relative height of the processing vessel 320 with respect to the spin head 340 may be changed as the processing vessel 320 moves in the vertical direction. The lifting unit 360 may include a bracket 362, a moving shaft 364, and a driver 366. The bracket 362 may be fixedly installed on an outer wall of the processing vessel 320. The bracket 362 may be fixed to the moving shaft 364 that is moved in the vertical direction by the driver 366. The lifting unit 360 may lower the processing vessel 320 so that the spin head 340 protrudes upwardly from the processing vessel 320 when the substrate W is placed on or lifted from the spin head 340. In addition, when the process is performed, the lifting unit 360 may adjust a height of the processing vessel 320 so that the treatment liquid may be introduced into the set recovery containers 322 and 326 according to the type of the treatment liquid supplied to the substrate W.

Unlike the above, the lifting unit 360 may move the spin head 340 in the vertical direction instead of the processing vessel 320.

The liquid discharge unit 400 may discharge various types of liquids onto the substrate W. The liquid discharge unit 400 may include a plurality of nozzles 410 to 430. Each of the nozzles 410 to 430 may be moved to a process position and a standby position. Here, the process position is a position at which the nozzles 410 to 430 may discharge the liquid onto the substrate W located in the processing vessel 320, and the standby position is a position where the nozzles 410 to 430 are out of the process position and wait. According to an example, the process position may be a position at which the nozzles 410 to 430 may supply a liquid to the center of the substrate W. For example, when viewed from the top, the nozzles 410 to 430 may be moved linearly or axially to be moved between the process position and the standby position.

The plurality of nozzles 410 to 430 may discharge different types of liquids. The liquid discharged from the nozzles 410 to 430 may include a chemical, a rinse liquid, and a drying fluid. Referring to the exemplary embodiment of FIG. 2, a first nozzle 410 may be a nozzle for discharging chemicals. A second nozzle 420 may be a nozzle that discharges a rinse liquid. A third nozzle 430 may be a nozzle that discharges a drying fluid. For example, the chemical may be a liquid capable of etching a film formed on the substrate W or removing particles remaining on the substrate W. The chemical may be a liquid having a property of a strong acid or a strong base. The chemical may include sulfuric acid, hydrofluoric acid, or ammonia. The rinse liquid may be a liquid capable of rinsing the chemicals remaining on the substrate W. For example, the rinse liquid may be pure water. The drying fluid may be provided as a liquid capable of replacing the residual rinse liquid on the substrate W. The drying fluid may be a liquid having lower surface tension than the rinse liquid. The drying fluid may be an organic solvent. The drying fluid may be isopropyl alcohol (IPA). The third nozzle 430 may be connected to the liquid supply unit 600 to be described later.

The airflow forming unit 500 may form a downdraft in the processing space 312. The airflow forming unit 500 may supply an airflow from an upper portion of the chamber 310 and exhaust the airflow from a lower portion of the chamber 310. The airflow forming unit 500 may include an airflow supply unit 520 and an exhausting unit 540. The airflow supply unit 520 and the exhaust unit 540 may be disposed to face each other vertically.

The airflow supply unit 520 may supply gas in a downward direction. The gas supplied from the airflow supply unit 520 may be air from which impurities are removed. The airflow supply unit 520 may include a fan 522, an airflow supply line 524, a supply valve 528, and a filter 526. The fan 522 may be installed on the ceiling surface of the chamber 310. When viewed from above, the fan 522 may be positioned to face the processing vessel 320. The fan 522 may supply air toward the substrate W positioned in the processing vessel 320. The airflow supply line 524 may be connected to the fan 522 to supply air to the fan 522. The supply valve 528 may be installed in the airflow supply line 524 to adjust the supply amount of the airflow. The filter 526 may be installed in the airflow supply line 524 to filter the air. For example, the filter 526 may remove particles and moisture contained in the air.

The exhaust unit 540 may exhaust the processing space 312. The exhaust unit 540 may include an exhaust pipe 542, an exhaust line 544, a decompressing member 546, and an exhaust valve 548. The exhaust pipe 542 is installed on the bottom surface of the chamber 310 and may be provided as a pipe for exhausting the processing space 312. The exhaust pipe 542 may be positioned such that an exhaust port faces upwardly. The exhaust pipe 542 may be positioned such that the exhaust port communicates with the interior of the processing vessel 310. That is, the upper end of the exhaust pipe 542 may be located in the processing vessel 320. Accordingly, the downdraft formed in the processing vessel 320 may be exhausted through the exhaust pipe 542. An exhaust line 544 may be connected to the exhaust pipe 542. The decompressing member 546 and the exhaust valve 548 may be installed in the exhaust line 544.

The decompressing member 546 may decompress pressure of the exhaust pipe 542. A negative pressure may be formed in the exhaust pipe 542 by the decompressing member 546, which may exhaust the processing vessel 320. The exhaust valve 548 is installed in the exhaust pipe 542, and may open and close the exhaust port of the exhaust pipe 542. The exhaust valve 548 may adjust the amount of exhaust.

Figure 3:
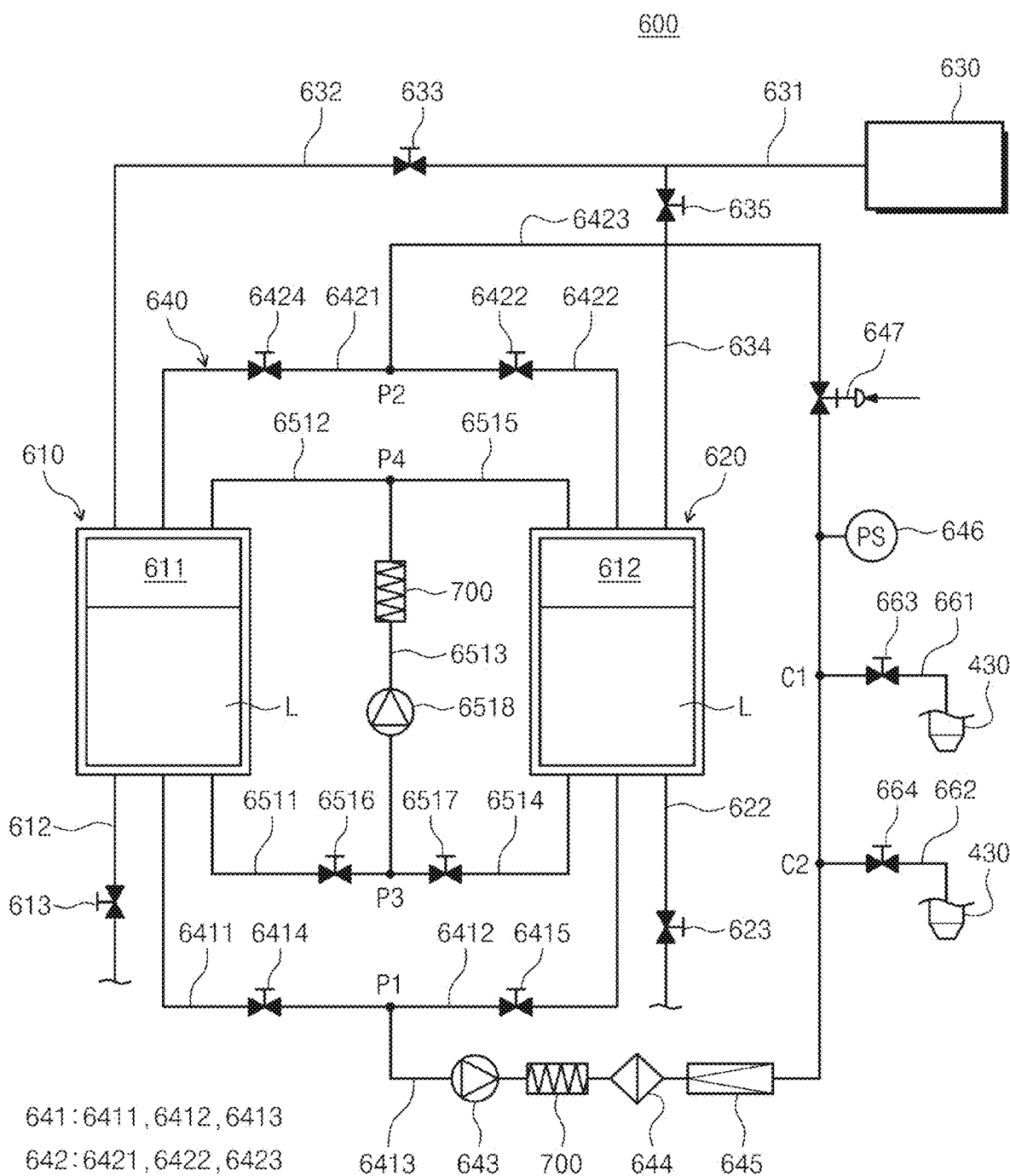
FIG. 3 is a view schematically illustrating the liquid supply unit of FIG. 2.

FIG. 3 is a view schematically illustrating the liquid supply unit of FIG. 2.

The liquid supply unit 600 may include a first tank 610. The first tank 610 may have an internal space 611. The first tank 610 may be provided in a cylindrical shape in which the internal space 611 is formed. The treatment liquid may be contained in the internal space 611 of the first tank 610. An organic solvent may be contained in the first tank 610. Isopropyl alcohol (IPA) may be contained in the first tank 610. The first tank 610 may receive a treatment liquid from a liquid supply source 630 to be described later. The first tank 610 may be connected to the liquid supply source 630 through a first branch supply line 632 to be described later. The first tank 610 may receive the treatment liquid from the liquid supply source 630 through the first branch supply line 632 to be described later.

A temperature adjusting member (not illustrated) may be included in the first tank 610. The temperature adjusting member may be installed in the internal space 611 of the first tank 610. The temperature adjusting member may be installed to be submerged in the treatment liquid contained in the first tank 610. The temperature adjusting member may adjust the temperature of the treatment liquid contained in the first tank 610. However, the present invention is not limited thereto, and a temperature adjusting member may not be provided inside the first tank 610.

A sensor (not illustrated) may be disposed in the internal space 611 of the first tank 610. The sensor may detect the residual amount of treatment liquid contained in the internal space 611 of the first tank 610.

The first tank 610 may include a first discharge line 612. The first discharge line 612 may be connected to a lower wall of the first tank 610. The first discharge line 612 may discharge the treatment liquid contained in the internal space 611 of the first tank 610 to the outside. For example, when the treatment liquid contained in the first tank 610 is contaminated or it is time to replace the treatment liquid, the treatment liquid contained in the internal space 611 of the first tank 610 may be discharged to the outside through the first discharge line 612. A valve 613 may be installed in the first discharge line 612. The valve 613 may be provided as an on/off valve. The valve 613 may adjust whether or not to discharge the treatment liquid contained in the internal space 611 of the first tank 610 or the amount of treatment liquid discharged. For example, when the discharge of the treatment liquid contained in the first tank 610 is not required, the valve 613 is maintained in a closed state, and when the treatment liquid contained in the first tank 610 is discharged, the valve 613 may be maintained in an open state.

The liquid supply unit 600 may include a second tank 620. The second tank 620 may have an internal space 621. The second tank 620 may be provided in a cylindrical shape in which the internal space 621 is formed. The treatment liquid may be contained in the internal space 621 of the second tank 620. The second tank 620 may contain the same treatment liquid as the treatment liquid contained in the first tank 610. An organic solvent may be contained in the second tank 620. Isopropyl alcohol (IPA) may be contained in the second tank 620. The second tank 620 may receive a treatment liquid from the liquid supply source 630 to be described later. The second tank 620 may be connected to the liquid supply source 630 through a second branch supply line 633 to be described later. The second tank 620 may receive the treatment liquid from the liquid supply source 630 through the second branch supply line 633 to be described later.

A temperature adjusting member (not illustrated) may be included inside the second tank 620. The temperature adjusting member may be installed in the internal space 621 of the second tank 620. The temperature adjusting member may be installed to be submerged in the treatment liquid contained in the second tank 620. The temperature adjusting member may adjust the temperature of the treatment liquid contained in the second tank 620. However, the present invention is not limited thereto, and a temperature adjusting member may not be provided inside the second tank 620.

A sensor (not illustrated) may be disposed in the internal space 621 of the second tank 620. The sensor may detect the residual amount of treatment liquid contained in the internal space 621 of the second tank 620.

The second tank 620 may include a second discharge line 622. The second discharge line 622 may be connected to a lower wall of the second tank 620. The second discharge line 622 may discharge the treatment liquid contained in the internal space 621 of the second tank 620 to the outside. For example, when the treatment liquid contained in the second tank 620 is contaminated or it is time to replace the treatment liquid, the treatment liquid contained in the internal space 621 of the second tank 620 may be discharged to the outside through the second discharge line 622. A valve 623 may be installed in the second discharge line 622. The valve 623 may be provided as an on/off valve. The valve 623 may control whether or not to discharge the treatment liquid contained in the internal space 621 of the second tank 620 or the amount of treatment liquid discharged. For example, when it is not necessary to discharge the treatment liquid contained in the second tank 620, the valve 623 is maintained in a closed state, and when the treatment liquid contained in the second tank 620 is discharged, the valve 623 may remain open.

In the exemplary embodiment of FIG. 3, it is illustrated as the liquid supply unit 600 includes two tanks (the first tank 610 and the second tank 620), but the present invention is not limited thereto. For example, the liquid supply unit 600 may include only one tank. Alternatively, the liquid supply unit 600 may include three or more tanks. The liquid supply unit 600 may include a various number of tanks according to process efficiency, the type of the treatment liquid, the temperature condition of the treatment liquid, and the like.

The liquid supply unit 600 may include a liquid supply source 630. The treatment liquid may be stored in the liquid supply source 630. An organic solvent may be stored in the liquid supply source 630. Isopropyl alcohol (IPA) may be stored in the liquid supply source 630. The liquid supply source 630 may supply the treatment liquid to a tank connected to the liquid supply source 630. In the exemplary embodiment of FIG. 3, the liquid supply source 630 may supply the treatment liquid to the first tank 610 and/or the second tank 620.

An integrated supply line 631 may be connected to the liquid supply source 630. The integrated supply line 631 may be a passage for supplying the treatment liquid to the plurality of tanks when the liquid supply source 630 is connected to the plurality of tanks.

The integrated supply line 631 may be connected to the first tank 610. The integrated supply line 631 may be connected to the first tank 610 through the first branch supply line 632 branched from the integrated supply line 631. The liquid supply source 630 may be connected to the first tank 610 through the integrated supply line 631 and the first branch supply line 632. The treatment liquid stored in the liquid supply source 630 may be supplied to the first tank 610 through the integrated supply line 631 and the first branch supply line 632. A valve 633 may be installed in the first branch supply line 632. The valve 633 may be installed on the side of the first tank 610 based on a branch point of the integrated supply line 631 and the first branch supply line 632. The valve 633 may be installed downstream from the liquid supply source 630 in a direction toward the first tank 610 based on the branch point of the integrated supply line 631 and the first branch supply line 632. The valve 633 may be provided as an on/off valve. The valve 633 may adjust the supply amount of treatment liquid supplied to the first tank 610.

The integrated supply line 631 may be connected to the second tank 620. The integrated supply line 631 may be connected to the second tank 620 through the second branch supply line 634 branched from the integrated supply line 631. The liquid supply source 630 may be connected to the second tank 620 through the integrated supply line 631 and the second branch supply line 634. The treatment liquid stored in the liquid supply source 630 may be supplied to the second tank 620 through the integrated supply line 631 and the second branch supply line 634. A valve 635 may be installed in the second branch supply line 634. The valve 635 may be installed on the side of the second tank 620 based on a branch point of the integrated supply line 631 and the second branch supply line 634. The valve 635 may be installed downstream from the liquid supply source 630 in a direction toward the second tank 620 based on the branch point of the integrated supply line 631 and the second branch supply line 634. The valve 635 may be provided as an on/off valve. The valve 635 may adjust a supply amount of treatment liquid supplied to the second tank 620.

Meanwhile, in the exemplary embodiment of FIG. 3, it is illustrated that one liquid supply source 630 is included, and one liquid supply source 630 supplies the treatment liquid to the first tank 610 and the second tank 620, but the present invention is not limited thereto. For example, the liquid supply source 630 may include a plurality of liquid supply sources. For example, the liquid supply source 630 may be provided in a number corresponding to the number of tanks, and one liquid supply source may be connected to one tank.

The liquid supply unit 600 may include a main circulation line 640. The main circulation line 640 may circulate the treatment liquid contained in the first tank 610. The main circulation line 640 may circulate the treatment liquid contained in the second tank 620. The main circulation line 640 may supply the treatment liquid to the third nozzle 430 from the internal space 611 of the first tank 610 or recover the treatment liquid to the internal space 611 of the first tank 610. The main circulation line 640 may supply the treatment liquid to the third nozzle 430 from the internal space 621 of the second tank 620 or recover the treatment liquid to the internal space 621 of the second tank 620. Connection lines 661 and 662 for supplying the treatment liquid to the third nozzle 430 may be connected to the main circulation line 640. The connection lines 661 and 662 may include a plurality of connection lines 661 and 662. The plurality of connection lines 661 and 662 may be connected to a plurality of third nozzles 430 provided in the plurality of processing chambers. On/off valves 663 and 664 may be installed in the plurality of connection lines 661 and 662, respectively. The treatment liquid circulating in the main circulation line 640 may supply the treatment liquid to the third nozzle 430 through connection lines 661 and 662. Through this, the third nozzle 430 may supply the treatment liquid to the substrate W. In the exemplary embodiment of FIG. 3, the connection lines 661 and 662 and the third nozzle 430 are illustrated as two, but this is only an example, and the number of connection lines 661 and 662 and third nozzle 430 may be variously designed according to the number of chambers provided in the substrate processing facility or the capacity of the tank.

The main circulation line 640 may include a supply line 641. The supply line 641 may be connected to the lower wall of the tank. The supply line 641 may include a first supply line 6411 connected to the lower wall of the first tank 610. The supply line 641 may include a second supply line 6412 connected to the lower wall of the second tank 620. The supply line 641 may include a third supply line 6413 connected to a first point P1 where the first supply line 6411 and the second supply line 6412 meet. One end of the third supply line 6413 may be connected to the first point P1, and the other end of the third supply line 6413 may be connection points where the main supply line 640 and the connection lines 661 and 662 are connected.

A valve 6414 may be installed in the first supply line 6411. The valve 6414 may be provided as an on/off valve. The valve 6414 may be installed between the connection point of the first tank 610 and the first supply line 6411 and the first point P1. The valve 6414 may be maintained in an open state when the treatment liquid is supplied from the first tank 610 to the third nozzle 430. The valve 6141 may be maintained in a closed state when the treatment liquid is not supplied from the first tank 610 to the third nozzle 430. For example, the valve 6141 may be maintained in a closed state when the treatment liquid is supplied from the second tank 620 to the third nozzle 430. Also, the valve 6141 may be maintained in an open state when the treatment liquid is not supplied from the second tank 620 to the third nozzle 430. The treatment liquid contained in the first tank 610 may be supplied to the third nozzle 430 through the first supply line 6411, the third supply line 6413, and the connection lines 661 and 662.

A valve 6415 may be installed in the second supply line 6412. A valve 6415 may be installed in the second supply line 6412. The valve 6415 may be provided as an on/off valve. The valve 6415 may be installed between the connection point of the second tank 620 and the second supply line 6412 and the first point P1. The valve 6415 may be maintained in an open state when the treatment liquid is supplied from the second tank 620 to the third nozzle 430. The valve 6145 may be maintained in a closed state when the treatment liquid is not supplied from the second tank 620 to the third nozzle 430. For example, the valve 6145 may be maintained in a closed state when the treatment liquid is supplied from the first tank 610 to the third nozzle 430. Also, the valve 6141 may be maintained in an open state when the treatment liquid is not supplied from the first tank 610 to the third nozzle 430. The treatment liquid contained in the second tank 620 may be supplied to the third nozzle 430 through the second supply line 6412, the third supply line 6413, and the connection lines 661 and 662.

The main circulation line 640 may include a recovery line 642. The recovery line 642 may be connected to the upper wall of the tank. The recovery line 642 may include a first recovery line 6421 connected to the upper wall of the first tank 610. The recovery line 642 may include a second recovery line 6422 connected to the upper wall of the second tank 620. The recovery line 642 may include a third recovery line 6423 connected to a second point P2 where the first recovery line 6421 and the second recovery line 6422 meet. One end of the third recovery line 6423 may be connected to the second point P2, and the other end of the third recovery line 6423 may be connection points C1 and C2 where the main supply line 640 and the connection lines 661 and 662 are connected. That is, the connection points C1 and C2 may be branch points at which the connection lines 661 and 662 branch from the main supply line 640. Also, the connection points C1 and C2 may be junctions where the third supply line 6413 and the third recovery line 6423 meet.

A valve 6424 may be installed in the first recovery line 6421. The valve 6424 may be provided as an on/off valve. The valve 6424 may be installed between the connection point of the first tank 610 and the first recovery line 6421 and the second point P2. The valve 6424 may be maintained in an open state when the treatment liquid is recovered from the third nozzle 430 to the first tank 610. Alternatively, the valve 6424 may be maintained in an open state when the treatment liquid remaining after being supplied from the third supply line 6413 to the third nozzle 430 is recovered to the first tank 610. The valve 6241 may be maintained in a closed state when the treatment liquid is not recovered to the first tank 610. For example, the valve 6141 may be maintained in a closed state when the treatment liquid is supplied from the second tank 620 to the third nozzle 430. Also, the valve 6141 may be maintained in an open state when the treatment liquid is not supplied from the second tank 620 to the third nozzle 430. The treatment liquid recovered to the first tank 610 may be recovered through the third recovery line 6423 and the first recovery line 6421 in sequence.

A valve 6425 may be installed in the second recovery line 6422. The valve 6425 may be provided as an on/off valve. The valve 6425 may be installed between the connection point of the second tank 620 and the second recovery line 6422 and the second point P2. The valve 6425 may be maintained in an open state when the treatment liquid is recovered from the third nozzle 430 to the second tank 620. Alternatively, the valve 6425 may be maintained in an open state when the treatment liquid remaining after being supplied from the third supply line 6413 to the third nozzle 430 is recovered to the second tank 620. The valve 6245 may be maintained in a closed state when the treatment liquid is not recovered to the second tank 620. For example, the valve 6245 may be maintained in a closed state when the treatment liquid is supplied from the first tank 610 to the third nozzle 430. Also, the valve 6145 may be maintained in an open state when the treatment liquid is not supplied from the first tank 610 to the third nozzle 430. The treatment liquid recovered to the second tank 620 may be recovered through the third recovery line 6423 and the second recovery line 6422 in sequence.

The liquid supply unit 600 may include a pump 643. The pump 643 may be installed on the third supply line 6413. The pump 643 may be installed at a position closer to the first point P1 than the connection points C1 and C2 on the third supply line 6413. The pump 643 may be installed on the third supply line 6413 between the first point P1 and the filter 644 to be described later. The pump 643 may be installed between the first point P1 and a heater module 700 to be described later on the third supply line 6413. The pump 643 may provide power so that the treatment liquid contained in the first tank 610 or the second tank 620 moves inside the supply line. For example, the pump 643 may be a decompressing pump. The pump 643 may provide decompressing force to the inside of the supply line so that the treatment liquid may move inside the supply line. The pump 643 may provide suction force inside the supply line so that the treatment liquid may move inside the supply line. The pump 643 may form negative pressure inside the supply line so that the treatment liquid may move inside the supply line.

The liquid supply unit 600 may include a filter 644. The filter 664 may be installed on the third supply line 6413. The filter 664 may be installed between the pump 643 and the connection points C1 and C2 on the third supply line 6413. The filter 664 may be installed between the pump 643 and a flow meter 645 to be described later on the third supply line 6413. The filter 644 may be installed between the heater module 700 and the flow meter 645. Alternatively, the filter 644 may be installed between the pump 643 and the heater module 700. That is, the positions of the filter 644 and the heater module 700 may be changed from each other. The filter 644 may filter residual contaminants, particles, and the like remaining in the treatment liquid before the treatment liquid is supplied to the nozzle 430.

The liquid supply unit 600 may include the heater module 700. The heater module 700 may be installed on the third supply line 6413. The heater module 700 may be installed between the pump 643 and the filter 644. Alternatively, the heater module 700 may be installed between the filter 644 and the flow meter 645. The heater module 700 may heat the treatment liquid flowing through the supply line to a temperature equal to or below the boiling point. For example, the heater module 700 may heat the treatment liquid to about 77° C. The structure of the heater module 700 will be described below.

The liquid supply unit 600 may include the flow meter 645. The flow meter 645 may be installed on the third supply line 6413. The flow meter 645 may be installed between the filter 644 and the connection points C1 and C2. Alternatively, the flow meter 645 may be installed between the heater module 700 and the connection points C1 and C2. The flow meter 645 may measure the flow rate of the treatment liquid flowing through the third supply line 6413. For example, the flow meter 645 may measure the flow rate by measuring a change in unit area or a change in mass of the treatment liquid flowing through the third supply line 6413 per hour. However, the present invention is not limited thereto, and various methods for measuring the flow rate flowing through the third supply line 6413 may be applied.

The liquid supply unit 600 may include a pressure sensor 646. The pressure sensor 646 may be installed on the third recovery line 6423. The pressure sensor 646 may be installed between the connection points C1 and C2 and the second point P2. The pressure sensor 646 may be installed between a static pressure regulator 647 to be described later and the second point P2. The pressure sensor 646 may sense the flow pressure of the organic solvent before the organic solvent is supplied to the third nozzle 430. The first pressure sensor 664 may detect a change in the flow rate of the organic solvent passing through the inside of a sixth supply line 661f. Alternatively, the pressure sensor 646 may measure the pressure when the treatment liquid remaining after being supplied to the third nozzle 430 flows the inside of the third recovery line 6423.

The liquid supply unit 600 may include the static pressure regulator 647. The static pressure regulator 647 may be installed on the third recovery line 6423. The static pressure regulator 647 may be installed between the pressure sensor 646 and the second point P2. The static pressure regulator 647 may adjust the pressure in the internal circulation line 640 to be constantly maintained based on the pressure value measured by the pressure sensor 646.

The liquid supply unit 600 may include an internal circulation line 650. The internal circulation line 650 may circulate the treatment liquid contained in the first tank 610. The internal circulation line 650 may circulate the treatment liquid contained in the second tank 620. The internal circulation line 650 may adjust the temperature of the treatment liquid while circulating the treatment liquid contained in the first tank 610 and/or the second tank 620.

The internal circulation line 650 may include a first lower circulation line 6511 connected to the lower wall of the first tank 610, a first upper circulation line 6512 connected to an upper wall of the first tank 610, and a shared line 6513 connecting the first lower circulation line 6511 and the first upper circulation line 6512. A valve 6516 may be installed in the first lower circulation line 6511. The valve 6516 may be provided as an on/off valve. The valve 6516 may maintain an open state when the temperature of the treatment liquid contained in the first tank 610 is adjusted. For example, when the treatment liquid is supplied from the second tank 620 to the third nozzle 430, the valve 6516 may maintain an open state. That is, when the valve 6414 on the first supply line 6411 is in a closed state and the valve 6415 on the second supply line 6412 is in an open state at the same time, the valve 6516 on the first lower circulation line 6511 may be in an open state. The valve 6516 may maintain a closed state when the treatment liquid contained in the first tank 610 is not circulated on the internal circulation line 650. For example, when the treatment liquid is supplied from the first tank 610 to the third nozzle 430, the valve 6516 may maintain a closed state. That is, when the valve 6414 on the first supply line 6411 is in the open state and the valve 6415 on the second supply line 6412 is in the closed state at the same time, the valve 6516 on the first lower circulation line 6511 may be in the closed state. The treatment liquid contained in the internal space 611 of the first tank 610 may be circulated while sequentially flowing through the first lower circulation line 6511, the shared line 6513, and the first upper circulation line 6512.

The internal circulation line 650 may include a second lower circulation line 6514 connected to the lower wall of the second tank 620, a second upper circulation line 6515 connected to the upper wall of the second tank 620, and a shared line 6513 connecting the second lower circulation line 6514 and the second upper circulation line 6515. A valve 6517 may be installed in the second lower circulation line 6514. The valve 6517 may be provided as an on/off valve. The valve 6517 may maintain an open state when the temperature of the treatment liquid contained in the second tank 620 is adjusted. For example, when the treatment liquid is supplied from the first tank 610 to the third nozzle 430, the valve 6517 may maintain an open state. That is, when the valve 6414 on the first supply line 6411 is in an open state and the valve 6415 on the second supply line 6412 is a closed state, the valve 6511 on the second lower circulation line 6511 may be in an open state. The valve 6517 may maintain a closed state when the treatment liquid contained in the second tank 610 is not circulated on the internal circulation line 650. For example, when the treatment liquid is supplied from the first tank 620 to the third nozzle 430, the valve 6517 may maintain a closed state. That is, when the valve 6414 on the first supply line 6411 is the closed state and the valve 6415 on the second supply line 6412 is the open state at the same time, the valve 6517 on the second lower circulation line 6514 may be in a closed state. The treatment liquid contained in the internal space 621 of the second tank 620 may be circulated while sequentially flowing through the second lower circulation line 6514, the shared line 6513, and the second upper circulation line 6515.

The first lower circulation line 6511 may meet the second lower circulation line 6514 at a third point P3. The first upper circulation line 6512 may meet the second upper circulation line 6515 at a fourth point P4. The shared line 6513 may connect between the third point P3 and the fourth point P4. A pump 6518 may be installed on the shared line 6513. The pump 6518 may provide a reduced pressure on the internal circulation line 650 to circulate the treatment liquid contained in the first tank 610 or the treatment liquid contained in the second tank 620. The pump 6518 may be provided as a decompressing pump. The pump 6518 may be installed at a position closer to the third point P3 than the fourth point P4 on the shared line 6514. The pump 6518 may be installed between the heater module 700 and the third point P3.

The heater module 700 may be installed on the shared line 6513. The heater module 700 may adjust the temperature of the treatment liquid flowing through the internal circulation line 650. The heater module 700 may heat the treatment liquid flowing through the internal circulation line 650. The heater module 700 may heat the treatment liquid flowing through the internal circulation line 650 to a temperature equal to or below the boiling point. For example, the heater module 700 may heat the treatment liquid to about 77° C. The heater module 700 having the same structure as the heater module 700 installed in the third supply line 6413 may be installed in the shared line 6513. Hereinafter, the structure of the heater module 700 will be described below.

The liquid supply unit 600 may include the heater module 700. The heater module 700 may increase the temperature of the treatment liquid to a set temperature.

Figure 4:
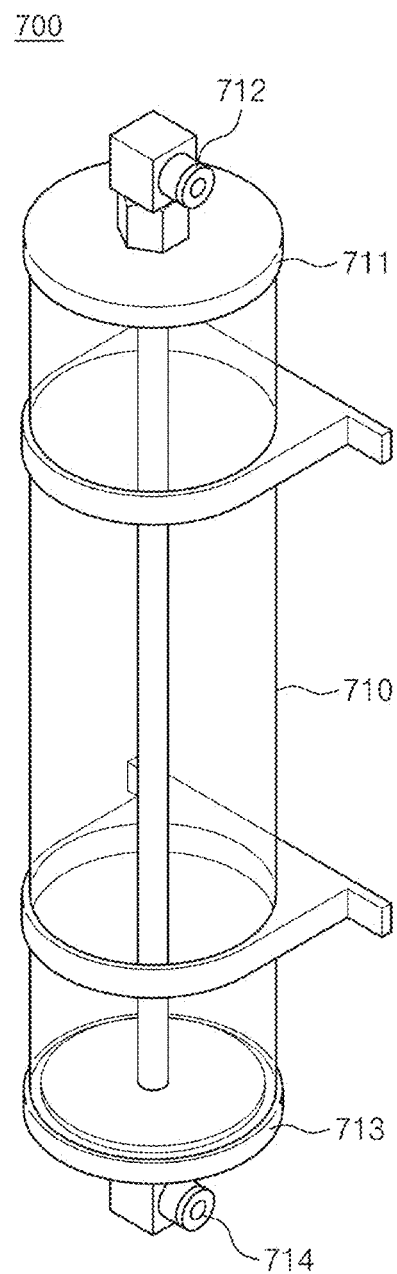
FIG. 4 is a perspective view of a heater module according to the exemplary embodiment of the present invention.
Figure 5:
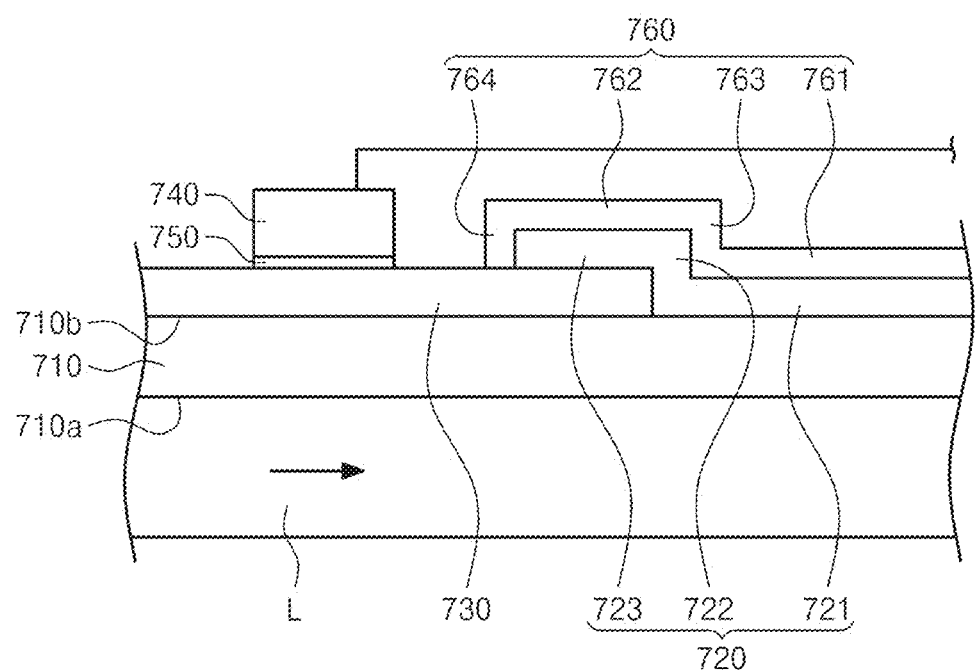
FIG. 5 is a cross-sectional view of a heater module according to the exemplary embodiment of the present invention.

FIG. 4 is a perspective view of the heater module according to the exemplary embodiment of the present invention, and FIG. 5 is a cross-sectional view of the heater module according to the exemplary embodiment of the present invention.

The heater module 700 may include a pipe 710. The pipe 710 may have an internal space through which the treatment liquid may flow. The pipe 710 may be provided in a tubular shape having an open top and an open bottom. For example, the pipe 710 may have a cylindrical cross-section. However, the present invention is not limited thereto, and the pipe 710 may have a cross-section in various shapes, such as a triangular shape, a square shape, and a polygonal shape.

The pipe 710 may include an upper cover 711 covering the upper opening. The upper cover 711 may be provided with an inflow member 712 to which the third supply line 6413 or the shared line 6513 is connected. The treatment liquid may be introduced into the internal space of the pipe 710 through the inflow member 712. The pipe 710 may include a lower cover 713 covering the lower opening. The lower cover 713 may be provided with an outflow member 714 to which the third supply line 6413 or the shared line 6513 is connected. The treatment liquid may flow from the internal space of the pipe 710 to the third supply line 6413 or the shared line 6513 through the outflow member 714.

The pipe 710 may be made of a quartz material. However, the present invention is not limited thereto, and the pipe 710 may be made of a material having low heat capacity and/or a material having low heat conductivity. The internal space of the quartz pipe 710 may be provided as a flow path through which the treatment liquid passes. An inner surface 710a of the pipe 710 made of quartz may be in direct contact with the treatment liquid. A heating element 720 to be described later may be provided on an outer surface 710b of the pipe 710 made of quartz. As the pipe 710 that is in direct contact with the treatment liquid L is made of a quartz material with low heat capacity and low thermal conductivity, when the substrate processing facility 1 or the substrate treating apparatus 300 is urgently stopped, the boiling phenomenon of the treatment liquid contained in the pipe 710 may be prevented.

The heater module 700 may include a heating element 720. The heating element 720 may be provided on the surface of the pipe 710. The heating element 720 may be provided on the outer surface 710b of the pipe 710. The heating element 720 may be in contact with the outer surface 710b of the pipe 710. The heating element 720 may be a heat source for heating the treatment liquid flowing through the pipe 710. The heating element 720 may be provided as a heating wire. The heating element 720 may be provided as a resistor. The heating element 720 may be provided on the outer surface 710b of the pipe 710 in a printing manner.

The heating element 720 is in contact with the outer surface 710b of the pipe 710, and may include a first portion 721 extending in the longitudinal direction of the pipe 710, a second portion 722 extending upwardly from at least a portion of the first portion 721, and a third portion 723 extending from the second portion 722 in the longitudinal direction of the pipe 710. The first portion 721 of the heating element 720 and the third portion 723 of the heating element 720 may be formed to have a step. A conductor terminal 730 to be described later may be disposed under the third portion 723 of the heating element 720. The second portion 722 of the heating element 720 may be in contact with one end of the conductor terminal 730. The third portion 723 of the heating element 720 may overlap at least a portion of the conductor terminal 730 in a direction perpendicular to the longitudinal direction of the pipe 710. The third portion 723 of the heating element 720 may be in contact with at least a portion of the conductor terminal 730. The third portion 723 of the heating element 720 may be in contact with the surface of at least a portion of the conductor terminal 730.

The heating element 720 may be made of a metal material. The heating element 720 may be made of AgPd or graphite.

The heater module 700 may include a temperature sensor (not illustrated) capable of measuring the temperature of the heating element 720.

The heater module 700 may include the conductor terminal 730. The conductor step 730 may be provided on the outer surface 710b of the pipe 710. The conductor terminal 730 may contact the outer surface 710b of the pipe 710. The conductor terminal 730 may be formed to extend along the longitudinal direction of the pipe 710 on the outer surface 710b of the pipe 710. At least a portion of the conductor terminal 730 may be in contact with the heating element 720. At least a portion of the conductor terminal 730 may be provided under the third portion 723 of the heating element 720, and may be in contact with the third portion 723 of the heating element 720. One end of the conductor terminal 730 may be in contact with the second portion 722 of the heating element 720. The conductor terminal 730 may be made of a metal material. For example, the conductor terminal 730 may be made of silver (Ag). A terminal block 740 may be disposed on the conductor terminal 730. The conductor terminal 730 and the terminal block 740 may be coupled by a conductive adhesive 750. The conductor terminal 730 and the terminal block 740 may be electrically connected through a conductive adhesive 750. The conductive adhesive 750 may be provided as a silver paste (Ag sintering).

The heater module 700 may include the terminal block 740. The terminal block 740 may receive power from an external power source. The terminal block 740 may be coupled to the conductor terminal 730. The terminal block 740 is electrically connected to the conductor terminal 730 by the conductive adhesive 750. power applied to the terminal block 740 may be transmitted to the conductor terminal 730 through the conductive adhesive 750, power transmitted to the conductor terminal 730 is transmitted to the heating element 720 by the contact portion between the conductor terminal 730 and the heating element 720, and the heating element 720 may be heated by the received power.

The heater module 700 may include an insulator 760. The insulator 760 may be provided on the heating element 720. The insulator 760 may be provided to cover the exposed portion of the heating element 720. The insulator 760 may cover a contact portion between the heating element 720 and the conductor terminal 730. The insulator 760 may include a first insulating portion 761 covering the first portion 721 of the heating element 720, a second insulating portion 762 covering the third portion 723 of the heating element 720, a third insulating portion 763 connecting the first insulating portion 761 and the second insulating portion 762 and covering the second portion 722 of the heating element 720, and a fourth insulating portion 764 covering an end of the third portion 723 of the heating element 720. The insulator 760 may be formed of silicon dioxide ($SiO_2$). The insulator 760 may be provided to cover the exposed portion of the heating element 720 so that power transmitted to the heating element 720 and/or heat generated from the heating element 720 are not transmitted to other portions. Through this, loss of heat generated by the heating element 720 may be prevented. In addition, the insulator 760 may protect the heating element 720. The insulator 760 may prevent the exposed portion of the heating element 720 from being oxidized by external air.

In the exemplary embodiment of the present invention, by providing the heating element 720 on the outer surface 710b of the pipe 710 through which the treatment liquid flows therein, the heat transfer path from the heating element 720 to the treatment liquid L may be minimized, thereby increasing temperature increasing efficiency. Through this, there is an effect of shortening the preparation time of the treatment liquid L, improving productivity, and reducing power consumption. In addition, even when the facility is urgently stopped, since the heat transfer path is short and the heat latent in the heater module 700 is small, the boiling phenomenon of the treatment liquid L may be prevented. In addition, as the pipe 710 that is in direct contact with the treatment liquid L is made with a quartz material that is chemically stable and has inert properties, it is possible to prevent damage to the pipe 710 by the heating element 720 that is a heat source. In this case, since the metal particulates generated from the metal heating element 720 do not penetrate into the internal space of the pipe 710, contamination of the treatment liquid L due to the metal particulates may be prevented. Therefore, compared to a heater module using a fluororesin-based pipe, the content of particles in the treatment liquid L is small, so that the process yield may be increased.

The controller 900 may control the overall operation of the substrate processing facility 1. The controller 900 may include a Central Processing Unit (CPU), Read Only Memory (ROM), and Random Access Memory (RAM). The CPU executes desired processing, such as liquid processing and drying processing, which will be described later, according to various recipes stored in these storage areas. In the recipe, process time, process pressure, press temperature, various gas flow rates, and the like, which are control information of the apparatus for process conditions, are input. In addition, recipes indicating these programs and processing conditions may be stored in a hard disk or semiconductor memory. In addition, the recipe may be set at a predetermined position in the storage area while being accommodated in a portable computer-readable storage medium such as a CD-ROM or DVD.

Figure 6:
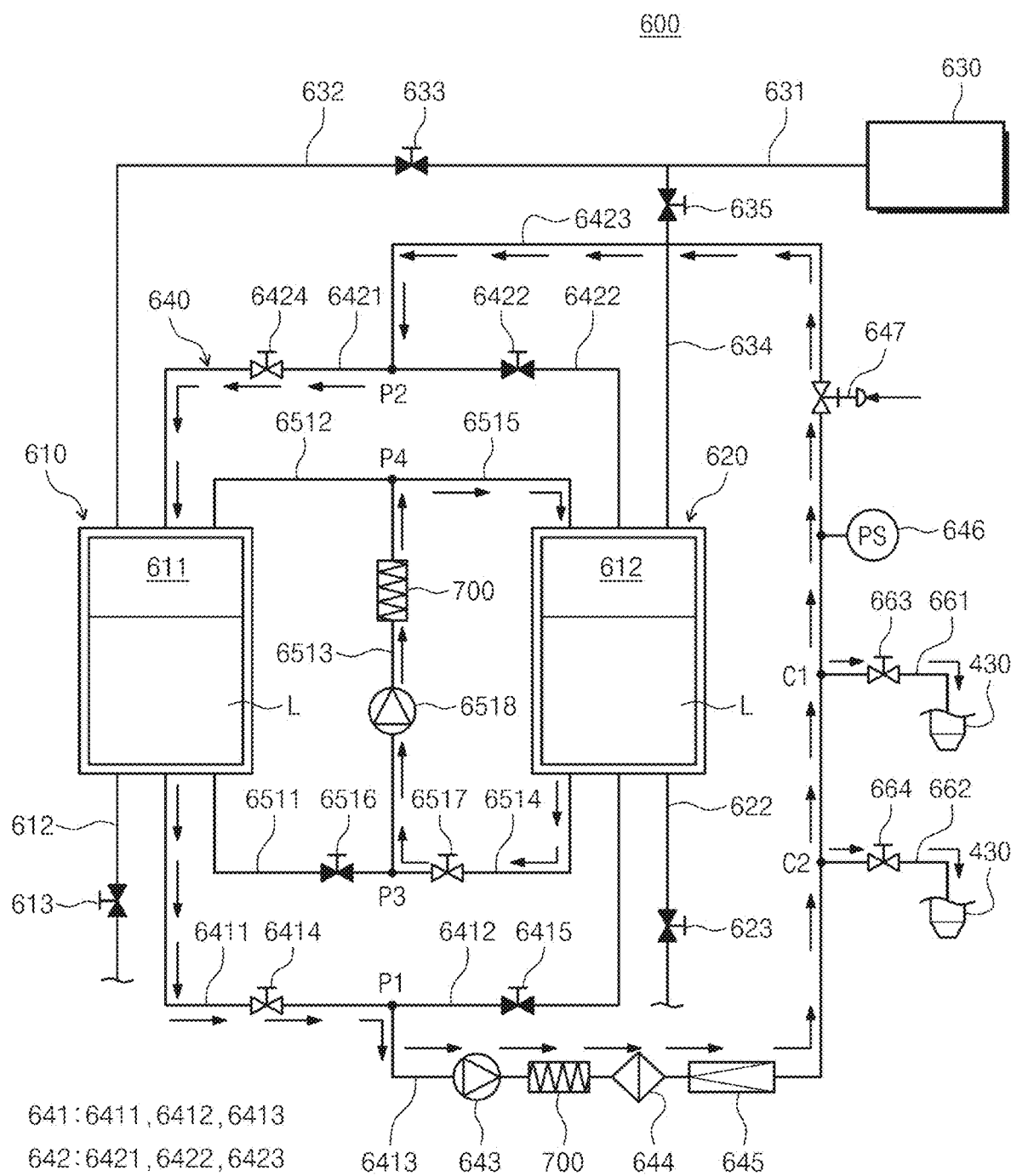
FIG. 6 is a diagram schematically illustrating a process in which a treatment liquid is supplied from a first tank to a nozzle according to the exemplary embodiment of the present invention.
Figure 7:
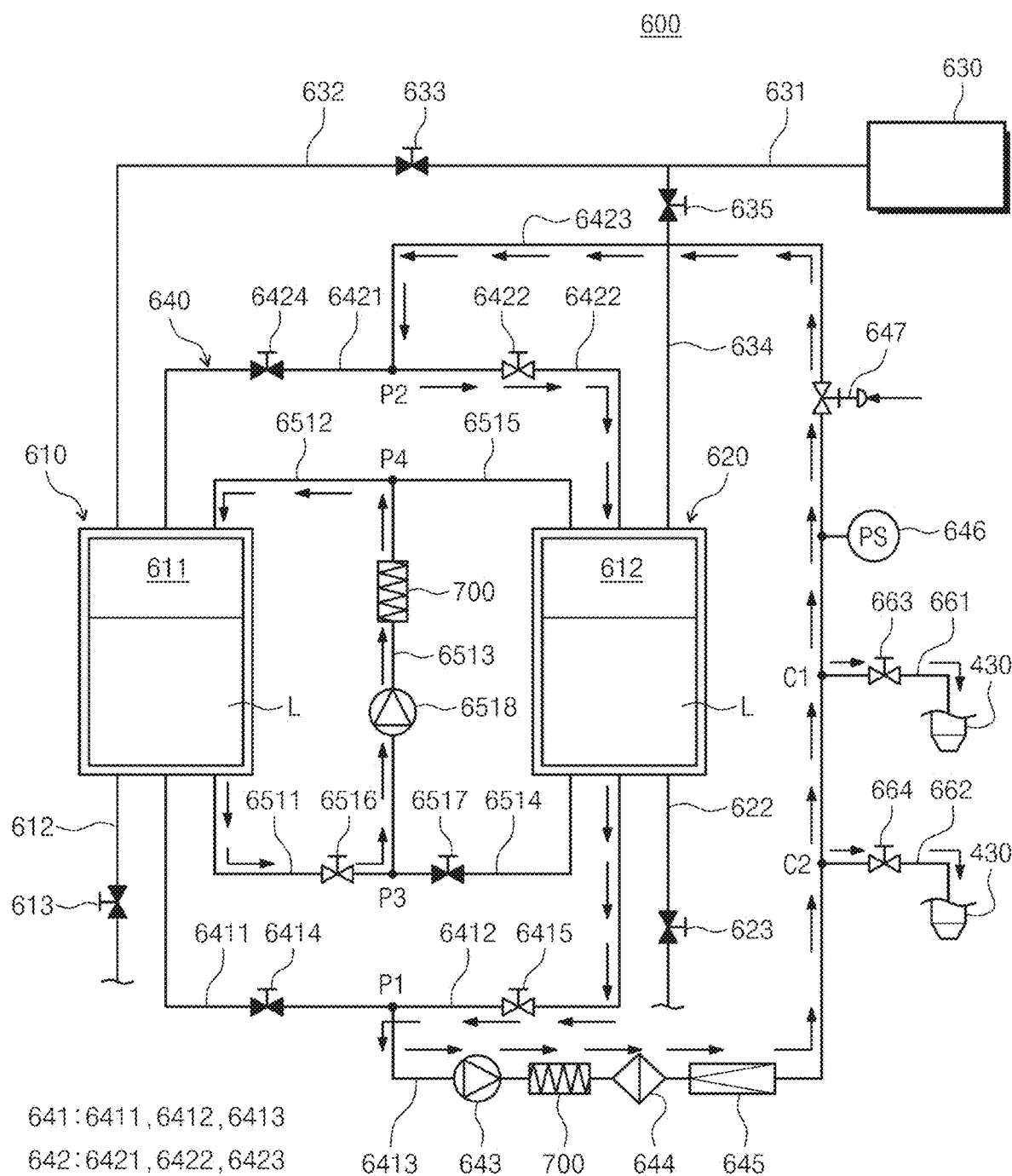
FIG. 7 is a diagram schematically illustrating a process in which a treatment liquid is supplied from a second tank to a nozzle according to the exemplary embodiment of the present invention.

FIG. 6 is a diagram schematically illustrating a process in which a treatment liquid is supplied from the first tank to the nozzle according to the exemplary embodiment of the present invention, and FIG. 7 is a diagram schematically illustrating a process in which a treatment liquid is supplied from the second tank to the nozzle according to the exemplary embodiment of the present invention.

The controller 900 may control the liquid supply unit 600. The controller 900 may control the valves included in the liquid supply unit 600. The controller 900 may control whether to open and close the valves included in the liquid supply unit 600.

Referring to FIG. 6, the valve 6414 of the first supply line 6411 and the valve 6424 of the first recovery line 6421 are maintained in an open state, and the valve 6415 of the second supply line 6412 and the valve 6425 of the second recovery line 6422 are maintained in a closed state. In this case, the treatment liquid L contained in the first tank 610 is supplied to the third nozzle 430 by sequentially passing through the first supply line 6411, the third supply line 6413, and the connection lines 661 and 662. The treatment liquid L is heated by the heater module 700 while flowing through the third supply line 6413 to be supplied to the third nozzle 430. Among the treatment liquid L flowing in the third supply line 6413, the remaining treatment liquid L not supplied to the third nozzle 430 sequentially passes through the third recovery line 6423 and the first recovery line 6421 and is introduced into the internal space 611 of the first tank 610 .... Meanwhile, when the treatment liquid L is supplied from the first tank 610 to the third nozzle 430, the treatment liquid L contained in the second tank 620 is circulated along the internal circulation line 650 and is heated. At this time, the valve 6516 on the first lower circulation line 6511 is maintained in the closed state, and the valve 6517 on the second lower circulation line 6514 is maintained in the open state.

When the amount of treatment liquid L contained in the first tank 610 falls below a certain water level, the supply of the treatment liquid L in the first tank 610 is stopped, and the treatment liquid L is supplied from the second tank 620. The liquid supply source 630 supplies the treatment liquid L to the first tank 610, and the treatment liquid L filled in the first tank 610 is heated through the internal circulation line 650 while the treatment liquid L is supplied from the second tank 620 to the third nozzle 430.

Referring to FIG. 7, 7, the valve 6415 of the second supply line 6412 and the valve 6425 of the second recovery line 6422 are maintained in an open state, and the valve 6414 of the first supply line 6411 and the valve 6424 of the first recovery line 6421 are maintained in a closed state. In this case, the treatment liquid L contained in the second tank 620 is supplied to the third nozzle 430 by sequentially passing through the second supply line 6412, the third supply line 6413, and the connection lines 661 and 662. The treatment liquid L is heated by the heater module 700 while flowing through the third supply line 6413 to be supplied to the third nozzle 430. Among the treatment liquid L flowing in the third supply line 6413, the remaining treatment liquid L not supplied to the third nozzle 430 sequentially passes through the third recovery line 6423 and the second recovery line 6422 and is introduced into the internal space 611 of the second tank 620. Meanwhile, when the treatment liquid L is supplied from the second tank 610 to the third nozzle 430, the treatment liquid L contained in the first tank 610 is circulated along the internal circulation line 650 and is heated. In this case, the valve 6517 on the second lower circulation line 6514 is maintained in the closed state, and the valve 6516 on the first lower circulation line 6511 is maintained in the open state.

In the above description, it has been described that the liquid supply unit 600 is a supply system for supplying isopropyl alcohol (IPA) to the substrate W, but the present invention is not limited thereto. The liquid supply unit 600 may be applied to any supply system that supplies a high-temperature treatment liquid among the treatment liquids supplied to the substrate W. For example, the treatment liquid may be provided as a chemical, such as sulfuric acid or phosphoric acid.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   a chamber having a processing space;
   a support unit configured to support and rotate the substrate in the processing space;
   a nozzle configured to supply a treatment liquid to the substrate supported by the support unit; and
   a liquid supply unit configured to supply the treatment liquid to the nozzle,
   wherein the liquid supply unit includes
      a tank configured to store the treatment liquid,
      a main circulation line configured to supply the treatment liquid from an internal space of the tank to the nozzle or to recover the treatment liquid to the internal space of the tank,
      a connection line connected to the main circulation line and configured to supply the treatment liquid to the nozzle, and
   a heater module configured to heat the treatment liquid to a temperature is in the main circulation line, the heater module including
      a pipe configured to flow the treatment liquid therethrough and made of a quartz material, and
      a heating element on a surface of the pipe,
   wherein the heater module includes a conductor terminal on the surface of the pipe and a terminal block coupled onto the conductor terminal and configured to receive power from an outside, and
   at least a portion of the conductor terminal is in contact with the heating element, and
   wherein the heating element includes a first portion extending in a longitudinal direction of the pipe while being in contact with the surface of the pipe, a second portion extending upwardly from the first portion and including an upper end and a lower end, and a third portion extending in the longitudinal direction of the pipe from the upper end of the second portion,
   the second portion is in contact with one end of the conductor terminal, and
   the third portion is in contact with the surface of the conductor terminal.

2. The apparatus of claim 1, wherein the heating element is on the surface of the pipe in a printing manner.

3. The apparatus of claim 1, wherein the heater module includes the heating element and an insulator covering an exposed portion of the heating element.

4. The apparatus of claim 1, wherein the conductor terminal and the terminal block are electrically connected through a conductive adhesive.

5. The apparatus of claim 4, wherein the heating element and the conductor terminal are made of metal.

6. The apparatus of claim 5, wherein
   the heating element is made of AgPd or graphite,
   the conductor terminal is made of with silver (Ag), and
   the conductive adhesive is provided as a silver paste (Ag sintering).

7. The apparatus of claim 3, wherein the insulator is made of silicon dioxide ($SiO_2$).

8. The apparatus of claim 1, wherein
the main circulation line includes a supply line configured to supply the treatment liquid stored in the internal space of the tank to the nozzle, and a recovery line configured to recover the treatment liquid from the nozzle to the tank, and
the heater module is in the supply line.

9. The apparatus of claim 1, wherein the heater module includes a temperature sensor configured to measure a temperature of the heating element.

10. The apparatus of claim 1, wherein
the liquid supply unit includes an internal circulation line configured to circulate the treatment liquid stored in the internal space of the tank, and
the heater module is in the internal circulation line.

11. The apparatus of claim 1, wherein the treatment liquid is isopropyl alcohol (IPA).

12. A liquid supply unit for supplying a treatment liquid to a nozzle that discharges the treatment liquid to a substrate, the liquid supply unit comprising:
a tank configured to store the treatment liquid;
a main circulation line configured to supply the treatment liquid from an internal space of the tank to the nozzle or to recover the treatment liquid to the internal space of the tank;
a supply line connected to the main circulation line and configured to supply the treatment liquid to the nozzle; and
a heater module in the main circulation line and configured to heat the treatment liquid flowing through the main circulation line to a temperature,
wherein the heater module includes
a pipe configured to flow the treatment liquid therethrough and made of a quartz material, and
a heating element on a surface of the pipe,
wherein the heater module includes a conductor terminal on the surface of the pipe and a terminal block coupled onto the conductor terminal and configured to receive power from an outside, and
at least a portion of the conductor terminal is in contact with the heating element, and
wherein the heating element includes a first portion extending in a longitudinal direction of the pipe while being in contact with the surface of the pipe, a second portion extending upwardly from the first portion and including an upper end and a lower end, and a third portion extending in the longitudinal direction of the pipe from the upper end of the second portion,
the second portion is in contact with one end of the conductor terminal, and
the third portion is in contact with the surface of the conductor terminal.

13. The liquid supply unit of claim 12, wherein
the conductor terminal is on the surface of the pipe in a cylindrical printing manner, and
the conductor terminal and the terminal block are electrically connected through a conductive adhesive.

14. The liquid supply unit of claim 12, wherein the heater module includes the heating element and an insulator covering a contact portion between the heating element and the conductor terminal.

15. An apparatus for treating a substrate, the apparatus comprising:
a chamber having a processing space;
a support unit configured to support and rotate the substrate in the processing space;
a nozzle configured to supply a treatment liquid to the substrate supported by the support unit; and
a liquid supply unit configured to supply the treatment liquid to the nozzle,
wherein the liquid supply unit includes
a first tank and a second tank configured to store the treatment liquid,
a main circulation line configured to connect the first tank and the second tank, the main circulation line configured to supply the treatment liquid to the nozzle or recover the treatment liquid to an internal space of the first tank or an internal space of the second tank, and
an internal circulation line configured to comment the first tank and the second tank, the internal circulation line configured to heat the treatment liquid contained in the internal space of the first tank or the internal space of the second tank,
wherein the main circulation line includes a supply line branched from the main circulation line and configured to supply the treatment liquid to the nozzle, and a recovery line branched from the main circulation line and configured to recover the treatment liquid from the nozzle to the first tank or the second tank,
the internal circulation line includes a lower circulation line connecting a lower wall of the first tank and a lower wall of the second tank, an upper circulation line connecting an upper wall of the first tank and an upper wall of the second tank, and a shared line connecting the lower circulation line and the upper circulation line, and
a heater module configured to heat the treatment liquid flowing therein to a temperature is in each of the supply line of the main circulation line and the shared line of the internal circulation line, the heater module including
a pipe configured to flow the treatment liquid therethrough and made of a quartz material,
a heating element on a surface of the pipe in a printing manner,
a conductor terminal on the surface of the pipe in a printing manner, at least a portion of the conductor terminal being in contact with the heating element, and
a terminal block coupled onto the conductor terminal through a conductive adhesive and configured to receive power from an outside,
wherein at least a portion of the conductor terminal is in contact with the heating element, and
wherein the heating element includes a first portion extending in a longitudinal direction of the pipe while being in contact with the surface of the pipe, a second portion extending upwardly from the first portion and including an upper end and a lower end, and a third portion extending in the longitudinal direction of the pipe from the upper end of the second portion,
the second portion is in contact with one end of the conductor terminal, and
the third portion is in contact with the surface of the conductor terminal.

16. The apparatus of claim 15, wherein the heater module includes an insulator covering an exposed portion of the heating element.

* * * * *